United States Patent [19]
Siniaguine et al.

[11] Patent Number: 6,105,534
[45] Date of Patent: Aug. 22, 2000

[54] APPARATUS FOR PLASMA JET TREATMENT OF SUBSTRATES

[75] Inventors: Oleg Siniaguine, San Jose, Calif.; Iskander Tokmouline, New Fairfield, Conn.

[73] Assignee: IPEC Precision, Inc., Bethel, Conn.

[21] Appl. No.: 09/194,247

[22] PCT Filed: May 30, 1997

[86] PCT No.: PCT/US97/09234

§ 371 Date: Nov. 25, 1998

§ 102(e) Date: Nov. 25, 1998

[87] PCT Pub. No.: WO92/45857

PCT Pub. Date: Dec. 4, 1997

Related U.S. Application Data

[60] Provisional application No. 60/018,587, May 31, 1996.

[51] Int. Cl.[7] .......................... C23C 16/00; C23C 16/513
[52] U.S. Cl. .................... 118/723 EB; 118/730; 118/723 FI
[58] Field of Search .................. 118/729, 730, 118/731, 719, 723 R, 723 MW, 723 VE, 723 E, 723, 723 IR, 723 EB, 723 FE, 723 FI; 156/345

[56] References Cited

U.S. PATENT DOCUMENTS

| | | | |
|---|---|---|---|
| 5,154,730 | 10/1992 | Hodos et al. | 118/730 |
| 5,474,642 | 12/1995 | Zorina et al. | . |
| 5,478,398 | 12/1995 | Nakanishi et al. | 118/726 |
| 5,697,749 | 12/1997 | Iwabuchi | 118/719 |
| 5,769,588 | 6/1998 | Toshima | 118/719 |
| 5,853,486 | 12/1998 | Ono et al. | 118/719 |
| 5,882,165 | 3/1999 | Maydan et al. | 118/719 |

FOREIGN PATENT DOCUMENTS

| | | |
|---|---|---|
| 9221220 | 11/1992 | WIPO . |
| 9621943 | 7/1996 | WIPO . |
| 9632742 | 10/1996 | WIPO . |

OTHER PUBLICATIONS

Dynamical Plasma Treatment of HIC (Hybrid Integrated Circuits) Substrates by U. Agrikov, P. Kulik, L. Poplevina and V. Ivanov, in original Russian language and English translation from Russian, excerpt from *Electronic Techniques*, Ser. 10, Microelectric Devices, 5(71), 1988, pp. 30–32, Russia.

*Primary Examiner*—Shrive Beck
*Assistant Examiner*—Sylvia R. MacArthur
*Attorney, Agent, or Firm*—Ware, Fressola, Van Der Sluys & Adolphson LLP

[57] ABSTRACT

An apparatus for processing substrates with a plasma jet with increased throughput is described. The apparatus comprises at least two carrousels for holding a plurality of substrates. Each of the carrousels includes a rotatable angle drive having a rotation axis Da, a plurality of arms extending radially from the angle drive and a plurality of rotatable substrate holders. Each of the substrate holders is connected to one of the arms, each of the rotatable substrate holders has a rotation axis Ha positioned at a distance R from the rotation axis Da of the rotatable angle drive. The carousel angle drive provides programmable motion of the substrates being treated relative to a plasma jet generator. The plasma jet generator is movable from a first position $Z_1$ adjacent to the first carrousel to a second position $Z_2$ adjacent to the second carrousel. While the substrates on the first carrousel are being treated by the plasma jet, the substrates on the second carrousel can be loaded or unloaded. Once the treatment of the substrates on the first carrousel is completed, the plasma jet is moved from the first position $Z_1$ to the second position $Z_2$ to treat the substrates on the second carrousel and allow loading and unloading of substrates from the first carrousel.

7 Claims, 4 Drawing Sheets

APPARATUS FOR PLASMA JET TREATMENT OF SUBSTRATES

CROSS REFERENCE TO RELATED APPLICATION

This application claims the benefit of U.S. Provisional Application No. 60/018,587, filed on May 31, 1996 and PCT International Application PCT/US97/09234, filed May 30, 1997, wherein the United States was a designated country.

BACKGROUND

1. Field of the Invention

The present invention relates to the treatment of substrates with a plasma jet. More particularly, the present invention relates to an apparatus for treating substrates with a plasma jet.

2. Description of the Prior Art

The application of plasma technology for treating substrates, such as wafers, is viewed as a replacement for liquid chemical treatment of substrates. U.S. Pat. No. 5,474,642 describes an apparatus for the plasma treatment of substrates. The apparatus described therein includes a means to generate a plasma jet at atmospheric pressure, and means to control both the cross-sectional size of the jet and the relative speed of movement. The apparatus consists of a closed process chamber, one or more substrate holders, a carousel, a plasma jet generator, and a device for moving the plasma jet generator all of which are located inside the process chamber. The process chamber is provided with system for providing a reactive gas and for exhausting gas. The carousel consists of angle drive and arms firmly connected with angle drive shaft. The substrate holders are attached to the ends of the carousel arms. Every substrate holder is made as a flat platform with vacuum chucks to hold a substrate. The plasma jet generator is directed to the flat platform of substrate holder. The device for moving plasma jet generator causes the plasma jet generator to move along the radius of the carousel parallel to carousel plane with a range of movement which is greater than the size of the substrate. The disadvantages of this apparatus is low throughput for the treatment of large size substrates and quality of substrate treatment.

In this apparatus, the plasma jet footprint is less than the substrate size. The substrate is held on the substrate holder flat platform by vacuum chucks. The carousel is rotated and the plasma jet periodically crosses the substrates on the substrate holder. After every crossing of the plasma jet, only part of the substrate is treated by the plasma jet. The treated part of the substrate looks like an arc with the width equal to the width of the plasma jet footprint having a radius equal to distance between the plasma generator and the carousel rotation axis. After every carousel revolution, the plasma generator is shifted along the carousel radius a distance which is less than the plasma jet footprint size to provide treatment of another portion of the substrate. With this shift, the plasma jet overlaps over the previously treated portion. The above described procedure is repeated until substrate surface has been treated completely.

When the substrate is passed across the plasma jet, the treated part of the substrate is heated and so after every passing of the plasma jet over the substrate, the substrate has to be cooled down to near its pre-treatment temperature to avoid heat accumulation in the substrate which can cause thermal damage of the substrate material. The duration $\tau_{cool}$ of cooling (10–30 seconds) is much longer than duration heating $\tau_{pass}$ of every substrate pass (0.05–0.15 seconds). So the duration $T_{treat}$ of whole substrate treatment and correspondingly the throughput G of the apparatus may be described as:

$$T_{treat} = M*(\tau_{pass} + \tau_{cool})*K \cong M*\tau_{cool}*D/(k*P)\tau_{pass} << \tau_{cool} \quad (1)$$

$$K = D/(k*P) \quad (2)$$

$$G = N/T_{treat} = N*k*P/(M*\tau_{cool}*D) \quad (3)$$

where M is the quantity of substrate passes to achieve required result of the treatment at any point of substrate surface, e.g. thick layer etch removal by consequent removal of M thin layers;

K is the quantity of necessary substrate passes to treat whole surface of the substrate with diameter D by plasma jet with cross-section P and with pass overlapping coefficient k≅0.7–0.3.

N is the quantity of simultaneously treated substrates on the carousel.

As it is seen from equations (1) and (2), as substrate size D becomes larger, a greater quantity of passes K are necessary to treat whole substrate surface and as a result the throughput G is reduced dramatically.

As only part of the substrate becomes heated after every crossing of the plasma jet over the substrate, high temperature gradients in the substrate result and in turn induce high thermo-elastic stress in the substrate which may cause undesirable deformation and damage, especially in the case where fragile mono-crystal semiconductor substrates are being treated. Moreover, for etching processes, the etch products removed from the treated part of the substrate may interact with cold surface of adjacent non-treated parts of the substrate and cause re-deposition and contaminations of the substrate. For plasma enhanced chemical vapor deposition, the non-uniform temperature distribution of the substrate surface may cause non-uniform material properties of deposited films and therefore unacceptable quality.

SUMMARY OF THE INVENTION

The present invention provides an apparatus for treating substrates with a plasma jet. The apparatus comprises at least two carrousels for holding a plurality of substrates. The carrousels further comprise a rotatable angle drive having a rotation axes $Da_1$ and $Da_2$, a plurality of arms extending radially from the angle drive, and a plurality of rotatable substrate holders, each of the substrate holders being connected to one of the arms, each of the rotatable substrate holders having a rotation axis $Ha_{1i}$, $Ha_{2i}$ positioned at a distance R from the rotation axis $Da_1$ and $Da_2$ of the rotatable angle drive. The apparatus also includes a plasma jet generator for providing a plasma jet. In the two carousel configuration, the apparatus provides a means for moving the plasma jet generator from a first position $Z_1$ adjacent to the first carousel to a second position $Z_2$ adjacent to the second carousel. While the substrates on the first carousel are being treated by the plasma jet, the substrates on the second carousel can be loaded or unloaded. Once the treatment of the substrates on the first carousel is completed, the plasma jet is moved from the first position $Z_1$ to the second position $Z_2$.

One object of the present invention is to provide an apparatus which provides high substrate throughput for large substrates.

The foregoing and other objects, features, and advantages will become apparent from the detailed description of the preferred embodiments invention as illustrated in the accompanying drawings.

BRIEF DESCRIPTION OF THE DRAWINGS

The drawings, which are not drawn to scale, include.

DETAILED DESCRIPTION OF THE PREFERRED EMBODIMENTS

Figure 1:
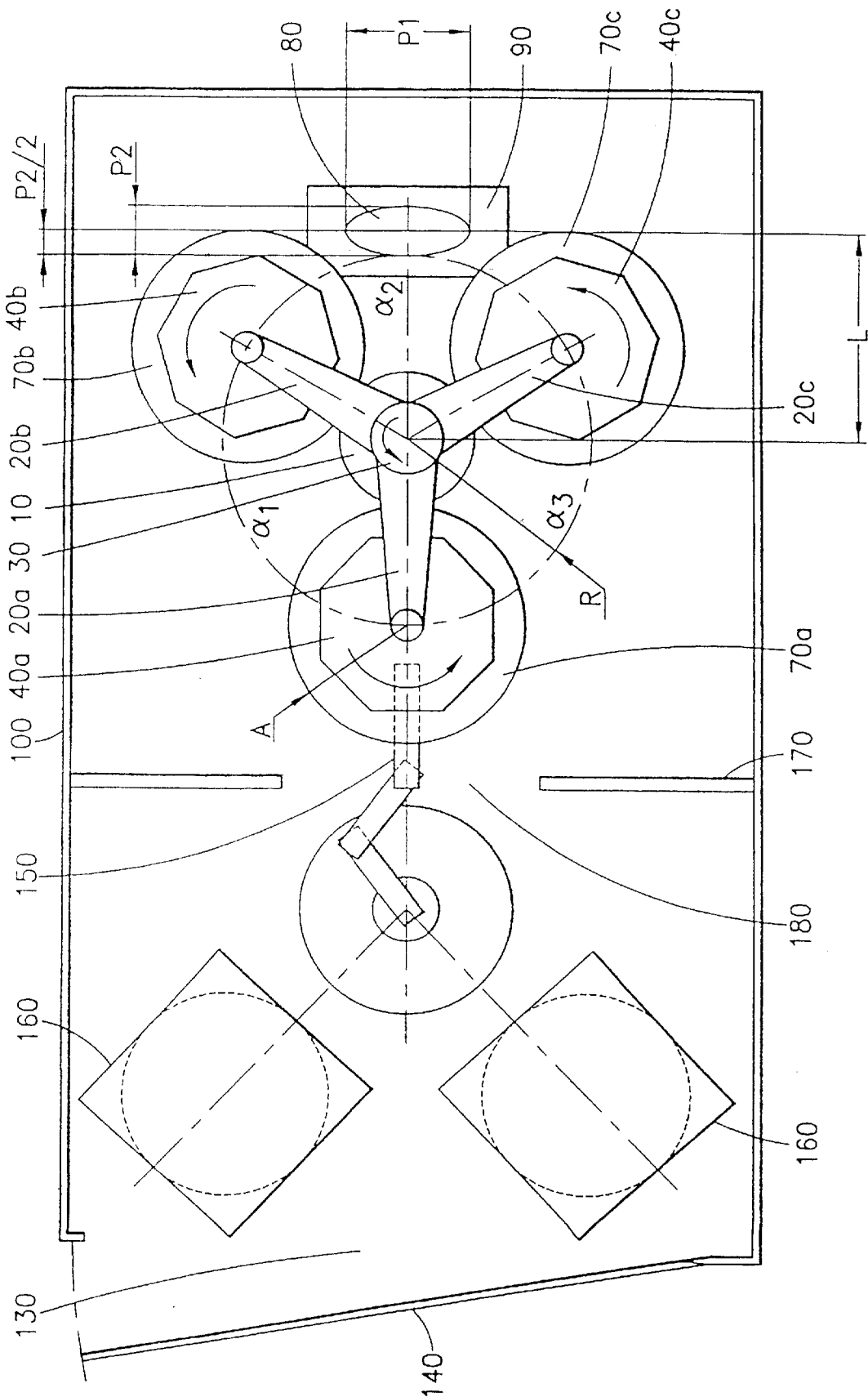
FIG. 1, which is a plan schematic diagram of an apparatus for plasma jet processing of substrates.
Figure 2:
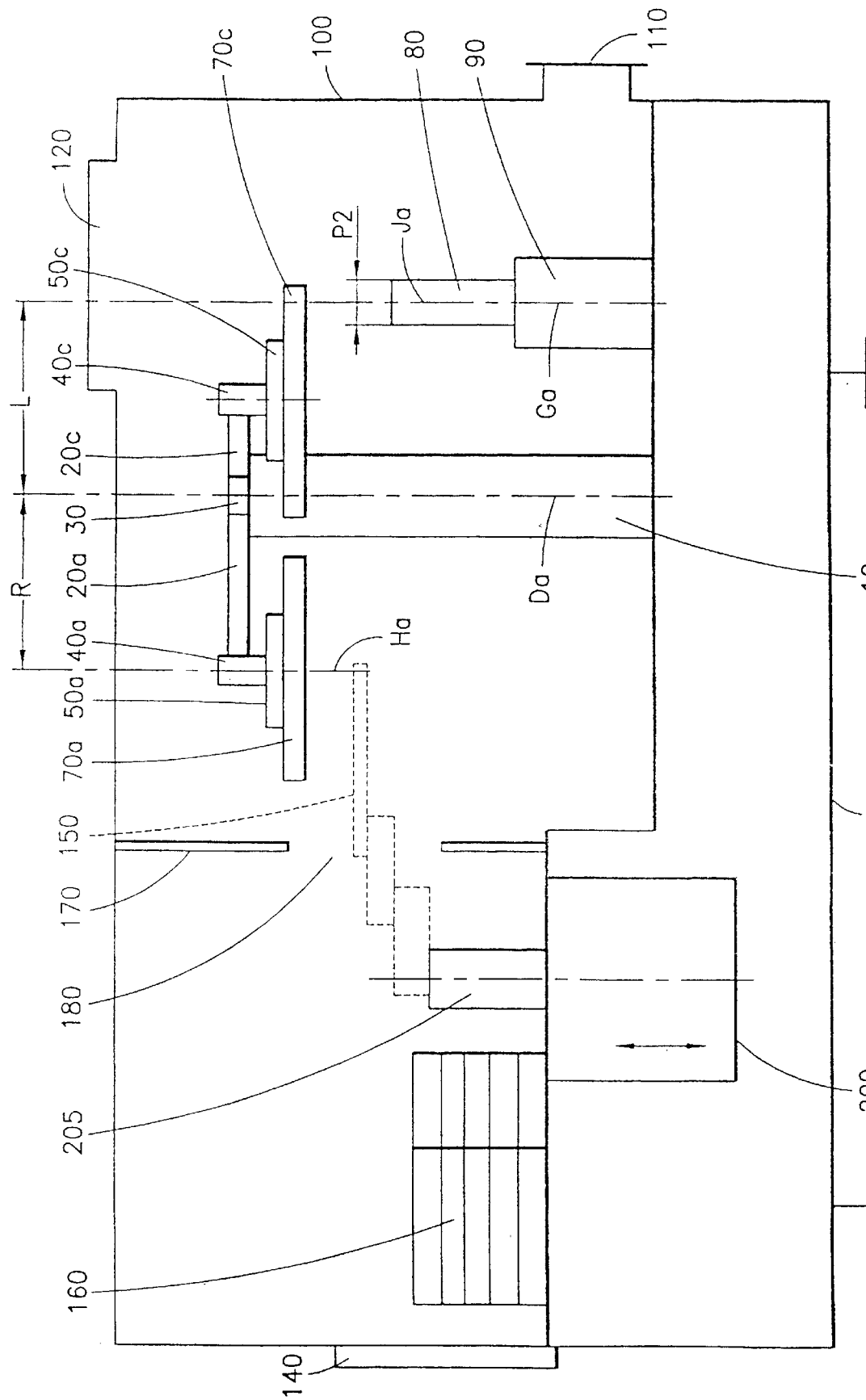
FIG. 2, which is an elevational schematic diagram of the apparatus illustrated in FIG. 1.

Referring to FIGS. 1 and 2, the apparatus 5 of the present invention comprises angle drive 10 and arms 20a–20c firmly attached to angle drive shaft 30. The angle drive 10 and a plurality of arms 20a–20c collectively forming a carousel. The angular velocity and the angular position of the angle drive 10 are controllable with a programmable stepping motor (not shown) attached to shaft 30.

Substrate holders 40a–40c are correspondingly attached to the ends of arms 20a–20c. The substrate holders 40a–40c further include flat platforms 50a–50c that may rotate around an axis Ha, which is normal to the plane formed by the flat platforms 50a–50c. The substrate holders 40a–40c are provided with rotation drives (not shown). Every substrate holder 40a–40c is made so that its rotation axis $Ha_i$ is positioned through the inertial center of its associated flat platform 50a–50c.

All of the substrate holder flat platforms 50a–50c are placed at a plane which is perpendicular to angle drive 10 axis. Each of the flat platforms 50a–50c are located at the same distance R, which is the distance between the rotation axis $Ha_i$ of the flat platforms 50a–50c and carousel angle drive 10 axis Da. Each of the flat platforms 50a–50c is provided with a substrate holding device (not shown), such as vacuum chucks or other known devices.

A plasma jet 80 is created by plasma jet generator 90 which is directed towards the flat platforms 50a–50c of substrate holders 40a–40c. In the preferred embodiment, the flat platforms 50a–50c are oriented downwardly, and the plasma jet generator 90 is oriented upwardly and placed at a level lower than the planes formed by the flat platforms 50a–50c. As a general rule, plasma jets have a longitudinal axis Ja in which the properties of the plasma jet, such as temperature, gas flow, irradiation, composition and other parameters, are substantially symmetrical. The plasma jet longitudinal axis Ja coincides with plasma jet generator axis Ga. Thus, because the plasma jet longitudinal axis Ja coincides with the plasma jet generator axis Ga, the position of the center of the plasma jet 80 in the planes of the flat platforms 50a–50c may be determined simply by the determining the position of the point in which the plasma jet generator axis Ga intersects the planes.

Figure 3:
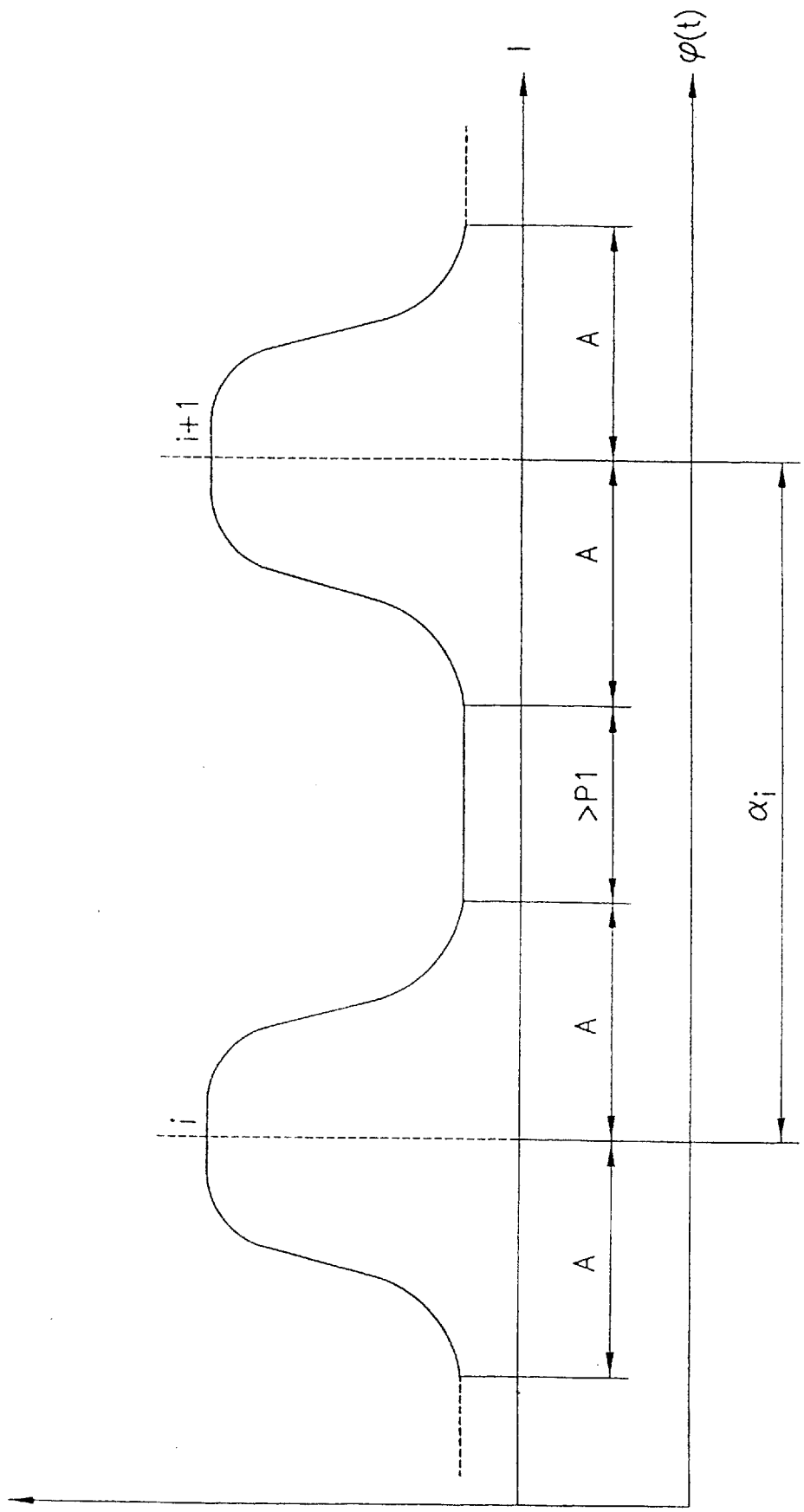
FIG. 3, which is a graph showing the relationship of the angular velocity of the carousel relative to the plasma jet for two passes of adjacent substrates over the plasma jet.

To meet the objective of uniform treatment of large substrates with high throughput, this apparatus and its motion system, is designed to have a plasma jet cross-sectional area that can be non-symmetrical. The advantage of a specific cross-section shape depends on the substrate size and the treatment application. In theory, for a plasma jet that is small relative to the substrate size and with a symmetric cross-section, a velocity function for the carousel as shown in FIG. 3 can be calculated that will give uniform treatment. However, the motion requirements for the carousel to achieve uniform treatment may be well beyond the dynamic operating range of conventional motion control systems. Instead of the smoothly varying velocity function of FIG. 3, such a velocity function may be so sharply peaked that it cannot be executed by conventional motion control hardware. By proper choice of the plasma jet cross-section shape, a smooth, easily executable velocity function for carousel motion can give uniform plasma jet treatment. The orthogonal axes of the plasma jet cross-section $P_1$ and $P_2$, FIG. 1, may be made unequal. FIG. 1 shows $P_1$ greater than $P_2$; depending on the application it can be advantageous to have $P_2$ greater than $P_1$. It also can be advantageous to have the intensity of the plasma jet along the axes $P_1$ and $P_2$ asymmetric with respect to the plasma jet center. One means of shaping the plasma jet cross-section is by injecting a stream of gas directly into the plasma jet 80 near the plasma jet generator 90. The flow pattern of the injected gas and the geometric configuration with the plasma jet generator 90 an substrate being treated can be used to shape the instantaneous plasma jet treatment pattern on the substrate.

The plasma jet generator 90 is positioned at a distance L between the axis Da of angle drive 10 and the point of intersection of the axis Ga of the plasma jet generator 90 and the planes of the flat platforms 50a–50c. Distance L is chosen from the range:

$$R-P_2/2<L<R+P_2/2 \tag{4}$$

where: $P_2$ is the plasma jet size in the plane of the flat platforms along the radius extending from angle drive axis Da to the plasma jet generator axis Ja; R is the distance between the rotation axis $Ha_i$ of the substrate holders 40a–40c and the axis Da of the angle drive 10. This ratio (4) is based on the technology requirements as described below.

Angles $\alpha_i$, such as $\alpha_1-\alpha_3$, between arms 20a–20c coming from angle drive 10 axis Da to adjoined flat platform 50a–50c rotation axes $Ha_i$, quantity N of substrate holders 40a–40c are chosen from the following:

$$a_i > (P_1 + A_i + A_{i+1})/L \tag{5}$$

$$\sum_{i=1}^{N} a_i = 2\pi \tag{6}$$

where: i is the substrate holder number;

$A_i$ is the maximum distance between an edge of the substrate holding devices 70a–70c and the ith substrate holder's rotation axis $Ha_i$;

$P_1$ is the plasma jet footprint cross-sectional dimension in the plane of the flat platforms 50a–50c along the direction perpendicular to the radius coming from angle drive 10 axis Da to plasma jet generator 90 axis Ga. The inequality (5) is based on the technology requirements, described below. The summation (6) is based on circle limitations.

The apparatus may be provided with a closed chamber 100 surrounding the substrate holders 40a–40c and the plasma jet generator 90. The closed chamber 100 is supplied with gas supply system 110, an exhaust system 120 and at least one access opening 130. Every access opening 130 is provided with a removable cover 140.

The apparatus may be provided with one or more manipulators 150 movable in the 3 orthogonal directions and cassettes 160 for the substrates. The manipulator 150 and cassettes are utilized for automatically loading and unloading the substrates onto substrate holders 40a–40c. Every manipulator 150 is positioned to reach the substrates in at least one cassette 160 for holding a plurality of substrates and to reach at least one substrate holder 40a–40c. Because the plasma jet 80 interacts with only the side of a substrate facing the plasma jet 80, and because it is sometimes desirable to treat both sides of a substrate with the plasma jet 80, the manipulator 150 may be provided with substrate holder which may turn the substrate upside down. The manipulator 150 and cassettes 160 may be placed inside the closed chamber 100 which is provided with opening 140. Opening 140 should be large enough for enabling a cassette to be passed through.

Still referring to FIGS. 1 and 2, the manipulator 150 and cassettes 160 may be separated from the substrate holder 40a–40c and plasma generator 90 by a wall 170. The manipulator 150 should be positioned to reach at least one substrate holder 40a–40c through the access opening 180 provided in the wall 170 which is dimensioned to permit a substrate to pass through.

The apparatus may be provided with a load elevator, not shown in FIGS. 1 and 2, which is located directly under the designated position for loading substrates onto the substrate holders 40a–40c. The elevator acts as a transfer station. Substrates are transported from the substrate cassettes 160 by the manipulator grip 150 to the elevator and then lifted by the elevator to the substrate holders. The load elevator moves parallel to the angle drive axis Da in the range not less than the sum of the substrate 70 thickness and the manipulator grip 150 thickness.

If a load elevator is used in the substrate handling, and if the apparatus employs more than one carousel, then either each carousel is provided with an elevator or one elevator is made with the possibility to be moved between the carousel load positions with an additional drive for this movement. Depending on the application, an elevator interface with the wafer holders 40a–40c may be chosen over direct loading into the substrate holders by the manipulator 150 for purposes of (1) providing an alignment mechanism on the elevator to aligning the substrates before loading to the wafer holders 40a–40c; and (2) simplifying the design of the manipulator 150 and the substrate holders 40a–40c by eliminating the requirement of interfacing the manipulator with the substrate holders.

According to the present invention, the substrates 70a–70c may be loaded onto the flat platforms 50a–50c manually or with the help of the manipulator 150 which takes the substrates 70a–70c from the cassette 160. If the substrates 70a–70c are kept treated side up in the cassette 160, the manipulator 150 must be able to turn them upside down for loading onto the flat platforms 50a–50c of the holders 40a–40c. If the manipulator does not reach all the substrate holders 40a–40c, the angle drive 10 is rotated so that the holders 40a–40c are sequentially accessible to the manipulator 150. The manipulator 150 picks up each substrate 70a–70c from the cassette 160, places it in the vicinity of one of the flat platforms 50a–50c of the substrate holders 40a–40c and the holding devices are turned on to hold the substrates 70a–70c. Unloading of the substrates 70a–70c after plasma treatment is conducted in reverse sequence.

For convenience of loading, sometimes the load elevator may be used. In that case the manipulator 150 picks up the substrates 70a–70c from the cassette, turns them up side down if it is necessary and places it onto the load elevator 200. Then the load elevator moves up until the substrates 70a–70c touch the flat platform 50a–50c of the substrate holder 40a–40c and the holding devices are turned on. Unloading of the substrates 70a–70c after plasma treatment is conducted in reverse sequence.

The plasma jet 80 is created by the plasma jet generator 90. The required temperature and composition of plasma are obtained by changing the gas composition, plasma generator 90 arc current, and the distance between the plasma jet generator 90 and the substrate flat platform 50.

Once the substrates 70a–70c are loaded, the flat platform rotation drives 60a–60c are turned on. The substrates 70a–70c rotate together with the corresponding substrate holders 40a–40c and flat platforms 50a–50c. The angle drive 10 is controlled to rotate with a varying angular velocity $\omega(t)$. The rotation of the angle drive causes the substrates 70a–70c to pass over the plasma jet 80. During processing, angular velocity $\omega(t)$ and angular position $\psi(t)$ of the angle drive 10 is controlled simultaneously. A graph of the angular velocity $\omega(t)$ versus length $l=\psi(t)*R$ alone the circumference with radius R and versus angular position $\psi(t)$ is shown in FIG. 3. The angular velocity profile for the angle drive 10 through a complete revolution of the angle drive 10 about its axis Da has a plurality of "bell" shapes. Each bell shape of the plurality corresponds to the angular velocity profile for passing the plasma jet under one of the substrates 70a–70c. Every "bell" starts when the substrates 70a–70c are at a distance P½ from the plasma jet 80. At this point, the angular velocity of the angle drive 10 is at a minimum. The angular velocity of the angle drive 10 is increased as the substrate holder rotation axis $Ha_i$ approaches the plasma jet axis Ja. When the rotation axis $Ha_i$ of the substrate holder is closest to the plasma jet axis Ja, the angular velocity of the angle drive 10 is at a maximum. The angular velocity is then reduced as the substrate holder rotation axis $Ha_i$ is moved away from the plasma jet axis Ja and again is made minimal at the distance P½ from the substrates' 70a–70c edge. The bell shaped angular velocity profile of the angle drive 10 is repeated for all of the substrates 70a–70c until the angle drive 10 makes a full revolution.

Due to simultaneous substrate rotation about axis $Ha_i$ and movement across the plasma jet 80 through rotation of the angle drive 10 with a controlled velocity profile, the substrates' 70a–70c surfaces are treated by the plasma jet 80 fully during each passing despite the fact that the plasma jet dimensions $P_1$ and $P_2$ are less than the area of the surface of the substrates 70a–70c. To provide the treatment uniformly (temperature of heating, thickness of removed or deposited layer), the frequency of rotation of the holders 40a–40c is chosen as high as possible and the shape of carousel angular velocity "bell" profile is found for actual process conditions by an optimization procedure.

As it seen from FIG. 3, the angle $\alpha_i$ between radii coming from angle drive axis Da to adjoined flat platform rotation axes should be more than $(P_1+A)/R$ to provide for completion of the ith "bell" profile and start (i+1) "bell" profile. The actual value of $\alpha_i$ is chosen from convenience of the design (e.g. rotation equilibrium conditions, possibility of substrate loading onto several substrate holders without additional carousel turn and so on).

To avoid having a non-treated central part of the substrate, the distance L between angle drive 10 axis Da and the point of crossing of plasma jet axis and flat platform plane should be chosen from the range:

$$R-P_2/2 < L < R+P_2/2 \qquad (7)$$

where: $P_2$-plasma jet size in the plane of the flat platforms 50a–50c along the radius coming from angle drive axis Da to plasma jet generator 90 axis Ga.

Every substrate 70a–70c is heated and treated sequentially during the angular rotation of the angle drive 10. The substrates 70a–70c are sequentially cooled while not in contact with the plasma jet 80. After a full revolution of the angle drive 10, each of the substrates 70a–70c have cooled sufficiently to be heated by the plasma jet 80 without overheating. The substrates 70a–70c are treated until the required result is achieved (e.g. thickness of the substrate is reduced or a sufficient layer of material is deposited). After complete treatment of the substrates 70a–70c, the plasma jet generator 90 may be turned off and substrates are unloaded from the substrate holders 40a–40c to the cassettes 160 by the procedure in reverse to the loading procedure.

The duration $T_{treat}$ of the treatment of all of the substrates 70a–70c and correspondingly the throughput G of the apparatus may be described analogously to ratios (1) and (3) as:

$$T_{treat}=M^*(\tau_{pass}+\tau_{cool}) \qquad (9)$$

$$\tau_{pass}<\tau_{cool} \qquad (10)$$

$$G=N/T_{treat}=N/(M^*(\tau_{pass}+\tau_{cool})) \qquad (11)$$

The duration $\tau_{pass}$ of every substrate pass (0.5–2.5 seconds) increases with the increase of substrate size D but is significantly less than duration $\tau_{cool}$ of cooling (100–30 seconds). Despite an increasing $\tau_{pass}$, the sum ($\tau_{pass}+\tau_{cool}$) rises very insignificantly. So, as it is seen from equations (9), (10) and (11) that throughput G is reduced insignificantly with substrate size increases.

Due to uniform heating of the whole substrates 70a–70c by the plasma jet 80, the temperature gradients and thermoelastic stress are minimized and the substrates are treated without any damage. Also, the probability of redeposition of removal products during etching or non-uniformity of material deposit during thin film deposition is diminished and treatment quality is higher.

Figure 4:
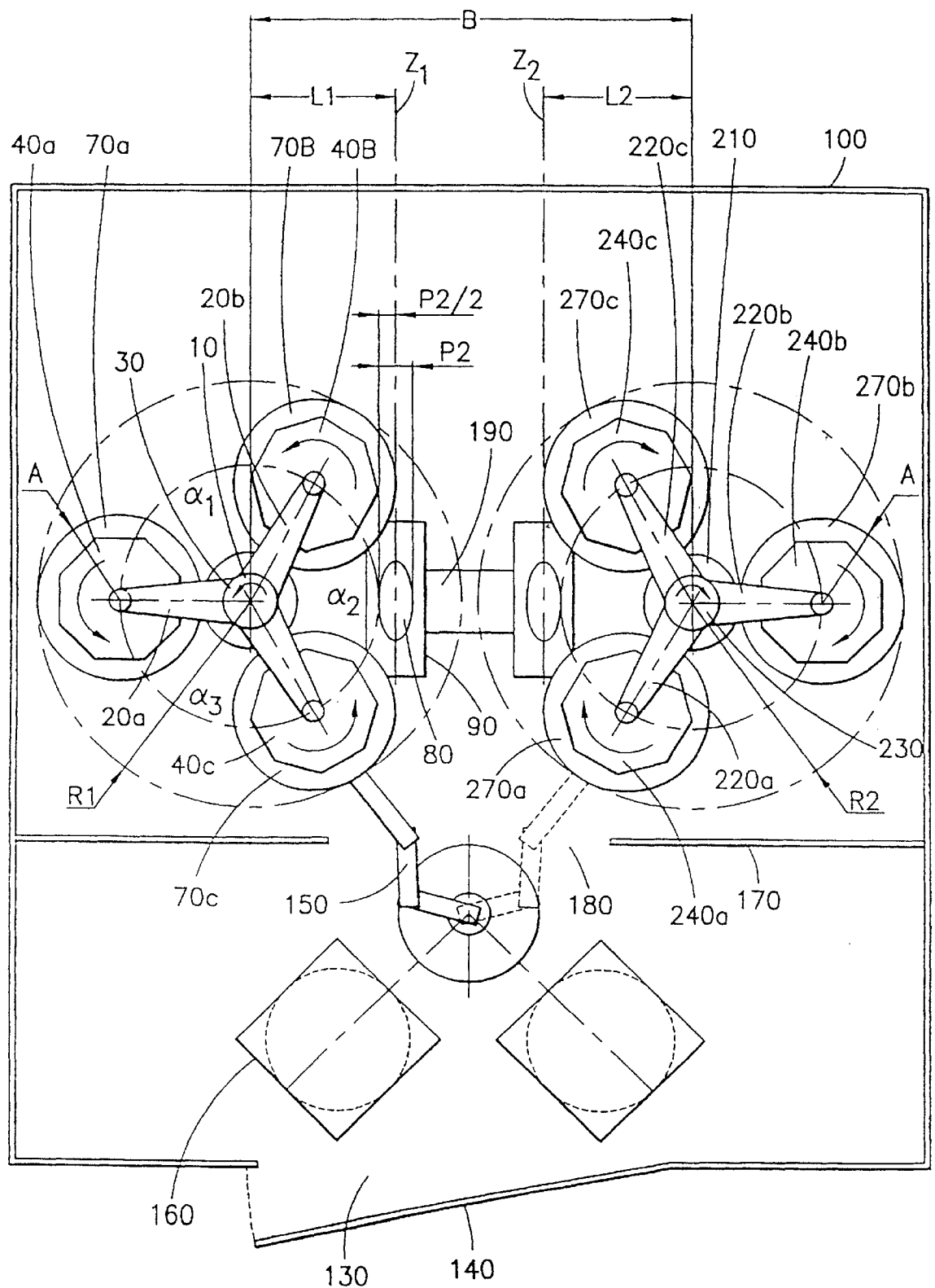
FIG. 4, which is a plan schematic diagram of an embodiment of the apparatus of the present invention for plasma jet processing of substrates showing a two carousel configuration.

Referring to FIG. 4, to improve throughput using a single plasma jet, the apparatus may be provided with an additional angle drive 210, arms 220a–220c, and substrate holders 240a–240c. The substrate holders 40a–40c and 240a–240c are placed in the same plane. The distance B between the axes of angle drive 10 and 210 is chosen from the ratio:

$$B>R_1+R_2+A_{max} \qquad (8)$$

where $R_1$ and $R_2$ are the distances between the rotation axes $Ha_{1i}$, $Ha_{2i}$ of every flat platform 40a–40c and 240a–240c and the axes $Da_1$ and $Da_2$ for the angle drives 10 and 210; and $A_{max}$ is the maximum distance is necessary to avoid collisions between substrate holders of different carrousels. The plasma jet generator 90 is provided with a device 190 for moving the plasma jet 80 between a point $Z_1$ where plasma jet generator 90 axis Ga intersects with the planes formed by the substrate holders 40a–40c and a point $Z_2$ where plasma jet generator 90 axis Ga intersects with the planes formed by the flat platforms formed by the substrate holders 240a–240c. Point $Z_1$ is positioned from the first angle drive's 10 axis $Da_1$ at a distance that is not more than L1<$R_1$+$P_2$/2. Point $Z_2$ is positioned from the second angle drive's 210 axis $Da_2$ at a distance that is not more than L2<$R_2$+$P_2$/2.

If the apparatus is provided with the second carousel to improve throughput, then the substrates 270a–270c are loaded onto the substrate holders 240a–240c of the second carousel during plasma jet processing of the substrates 70a–70c on the first carousel. The plasma jet generator 90 is positioned at a distance $L_1$ between the first carousel angle drive 10 axis and the point of intersection of the plasma jet generator 90 axis Ga and the planes of the flat platforms according to the range:

$$-R_1-P_2/2<L_1<R_1+P_2/2 \qquad (12)$$

where: $R_1$ is the distance between the rotation axes $Ha_{1i}$ of each of the flat platforms axis and carousel angle drive axis $Da_1$ of the first carousel.

After finishing treatment of the first carousel substrates 70a–70c, the plasma generator 80 is shifted to working position $Z_2$ which is located at a distance $L_2$ between the second carousel angle drive 210 axis Da and the point of intersection of plasma jet generator 90 axis Ga and the plane of the flat platforms. The distance $L_2$ is chosen from the range:

$$R_2-P_2/2<L_2<R_2+P_2/2 \qquad (13)$$

where: $R_2$ is the distance between the rotation axes $Ha_{2i}$ of each of the flat platforms 250a–250c and carousel angle drive axis Da of the second carousel angle drive 210. While the substrates 270a–270c on the second carousel are treated, the treated substrates 70a–70c are unloaded from the first carousel and fresh substrates are loaded.

After finishing treatment of the second carousel substrates 270a–270c, the plasma generator 90 is shifted back to the first working position $Z_1$ near the first carousel and the substrates 40a–40c on the first carousel are treated. This process is repeated. The two carousel embodiment of the present invention allows maximal effectiveness of plasma generator usage and maximum throughput.

As will be understood from the foregoing description, according to the present invention, several embodiments of the apparatus have been described for treating substrates with a plasma jet. It is to be understood that the embodiments described herein are merely illustrative of the principles of the invention. Various modifications may be made thereto by persons skilled in the art which will embody the principles of the invention and fall within the spirit and scope thereof. Hence, the present invention is deemed limited only by the appended claims and the reasonable interpretation thereof.

What is claimed is:

1. An apparatus for treating two pluralities of substrates with a plasma jet, the apparatus having a first carousel for holding a first plurality of substrates, and a second carousel for holding a second plurality of substrates, the apparatus further characterized in that each carousel has a rotatable angle drive (10, 210) having rotation axes $Da_1$, $Da_2$;
   a plurality of arms (20a–20c, 220a–220c) extending radially from the respective angle drives;
   a plurality of rotatable substrate holders (40a–40c, 240a–240c), each of the substrate holders being connected to one of the arms, each of the rotatable substrate holders having a rotation axis $Ha_{1i}$, $Ha_{2i}$ positioned at a distance R from the rotation axis $Da_1$, $Da_2$ of its respective angle drive;
   a plasma jet generator (90) for providing a plasma jet (80) having a first cross-sectional axis $P_1$ and a second cross-sectional axis $P_2$; and
   means (190) for moving the plasma jet generator from a first position $Z_1$ adjacent to the first carousel to a second position $Z_2$ adjacent to the second carousel.

2. The apparatus according to claim 1 further comprising:
   a first storage cassette (160) for storing a first plurality of substrates;
   a second storage cassette (160) for storing a second plurality of substrates; and a substrate manipulator (150) for transferring substrates between the first storage cassette and the first plurality of substrate holders and for transferring substrates between the second storage cassette and the second plurality of substrate holders.

3. The apparatus according to claim 2, wherein the manipulator (150) is provided with a means for rotating the substrates upside down.

4. The apparatus according to claim 3, wherein the apparatus further includes an elevator (200) having a substrate holder, wherein the elevator is positioned so as to reach at least one substrate holder.

5. The apparatus according to claim 4, wherein the housing (100) is provided with a wall (170) having an opening (110) therein, wherein the wall is positioned so as to provide a barrier between the first and second carrousels and the manipulator and cassettes.

6. The apparatus according to claim 1, wherein the apparatus further comprises a housing (100) which surrounds the apparatus.

7. The apparatus according to claim 1, wherein the cross-sectional axis $P_1$ of the plasma jet is aligned with the radius of rotation axes $Da_1$, $Da_2$ wherein the cross-sectional axis $P_2$ is perpendicular to axis $P_1$, and wherein $P_1$ is larger than $P_2$.

* * * * *

UNITED STATES PATENT AND TRADEMARK OFFICE
CERTIFICATE OF CORRECTION

PATENT NO. : 6,105,534
DATED : August 22, 2000
INVENTOR(S) : Oleg Siniaguine, et. al.

It is certified that error appears in the above-identified patent and that said Letters Patent is hereby corrected as shown below:

In the Abstract [57], lines 3 and 4, "carrousels" should be --carousels-- in both cases.

In column 2, lines 44 and 45, "carrousels" should be --carousels-- in both cases.

In column 3, line 31, "Ha," should be --$Ha_i$--.

In column 6, line 18, "alone" should be --along--.

In column 6, line 51, "it" should be --is--.

In column 7, line 20, "$\tau_{pass} < \tau cool$" should be --$\tau_{pass} < \tau_{cool}$--.

In column 7, line 48, please delete the second "is".

In column 7, line 49, "carrousels" should be --carousels--.

In column 8, line 4, "$-R_1$" should be --$R_1$--.

In column 10, line 1, claim 5, line 3, "110" should be --180--.

In column 10, line 2, claim 5, line 4, "carrousels" should be --carousels--.

Signed and Sealed this

First Day of May, 2001

Attest:

NICHOLAS P. GODICI

*Attesting Officer*    *Acting Director of the United States Patent and Trademark Office*